(12) United States Patent
Florian

(10) Patent No.: US 7,477,002 B2
(45) Date of Patent: Jan. 13, 2009

(54) PIEZO-ACTUATOR

(75) Inventor: Heinz Florian, Bad Gams (AT)

(73) Assignee: EPCOS AG, Munich (DE)

( * ) Notice: Subject to any disclaimer, the term of this patent is extended or adjusted under 35 U.S.C. 154(b) by 7 days.

(21) Appl. No.: 10/416,080

(22) PCT Filed: Nov. 7, 2001

(86) PCT No.: PCT/DE01/04180

§ 371 (c)(1),
(2), (4) Date: Oct. 15, 2003

(87) PCT Pub. No.: WO02/39510

PCT Pub. Date: May 16, 2002

(65) Prior Publication Data

US 2004/0051423 A1    Mar. 18, 2004

(30) Foreign Application Priority Data

Nov. 8, 2000    (DE) ............... 100 55 241

(51) Int. Cl.
*H01L 41/083* (2006.01)
(52) U.S. Cl. ............... 310/328; 310/311; 310/366
(58) Field of Classification Search ............. 310/311, 310/328, 366
See application file for complete search history.

(56) References Cited

U.S. PATENT DOCUMENTS

| | | | | |
|---|---|---|---|---|
| 5,073,740 A * | 12/1991 | Jomura et al. | ............... | 310/358 |
| 5,289,074 A * | 2/1994 | Mori | ............... | 310/328 |
| 5,410,210 A * | 4/1995 | Sato et al. | ............... | 310/363 |
| 5,438,232 A | 8/1995 | Inoue et al. | ............... | 310/328 |
| 6,191,522 B1 * | 2/2001 | Reuter | ............... | 310/328 |
| 6,208,026 B1 | 3/2001 | Bindig et al. | ............... | 257/718 |
| 6,236,146 B1 * | 5/2001 | Cramer et al. | ............... | 310/366 |
| 6,265,810 B1 * | 7/2001 | Ngo | ............... | 310/328 |
| 6,307,301 B1 * | 10/2001 | Ngo et al. | ............... | 310/328 |
| 6,462,464 B2 * | 10/2002 | Mitarai et al. | ............... | 310/366 |
| 6,731,050 B2 * | 5/2004 | Bindig et al. | ............... | 310/366 |
| 6,930,438 B2 * | 8/2005 | Cramer et al. | ............... | 310/328 |

FOREIGN PATENT DOCUMENTS

| | | |
|---|---|---|
| CN | 1230291 | 9/1999 |
| DE | 42 01 937 | 7/1992 |
| DE | 196 46 676 | 4/1998 |
| DE | 196 48 545 | 5/1998 |
| DE | 197 40 570 | 3/1999 |

(Continued)

OTHER PUBLICATIONS

Daniel J. Jendritza, Krefeld, Piezoaktoren im Großsignalbetrieb, Antriebstechnik, vol. 107, pp. 49 to 52 (1999) {original German-language version}.

(Continued)

*Primary Examiner*—Thomas M Dougherty
(74) *Attorney, Agent, or Firm*—Fish & Richardson P.C.

(57) ABSTRACT

An actuator includes a stack of piezoelectric layers, and electrode layers between the piezoelectric layers. A stabilization element is attached to a side surface of the stack. The stabilization element fixes a height of the stack so that the height does not change when an operating voltage is applied to at least one of the electrode layers.

19 Claims, 1 Drawing Sheet

FOREIGN PATENT DOCUMENTS

| | | | |
|---|---|---|---|
| DE | 199 28 178 | | 8/2000 |
| JP | 59-231884 | * | 12/1984 |
| JP | 02-237084 | | 9/1990 |
| JP | 06-224483 | * | 8/1994 |
| JP | 07-106653 | | 4/1995 |
| JP | 07-283453 | * | 10/1995 |
| JP | 11-214247 | * | 8/1999 |
| JP | 2003-324223 | * | 11/2003 |
| JP | 2005-108989 | * | 4/2005 |

OTHER PUBLICATIONS

Daniel J. Jendritza, Krefeld, Piezo-actuators in Main Signal Operation, Power Technology, vol. 107, pp. 49 to 52 (1999) {English-language translation of original German-language version}.

Second Office Action mailed on May 25, 2007 from Chinese Patent Application 01818581.9.

German Translation of Chinese Office Action mailed on May 25, 2007.

English Translation of rejections in Chinese Office Action Mailed on May 25, 2007.

* cited by examiner

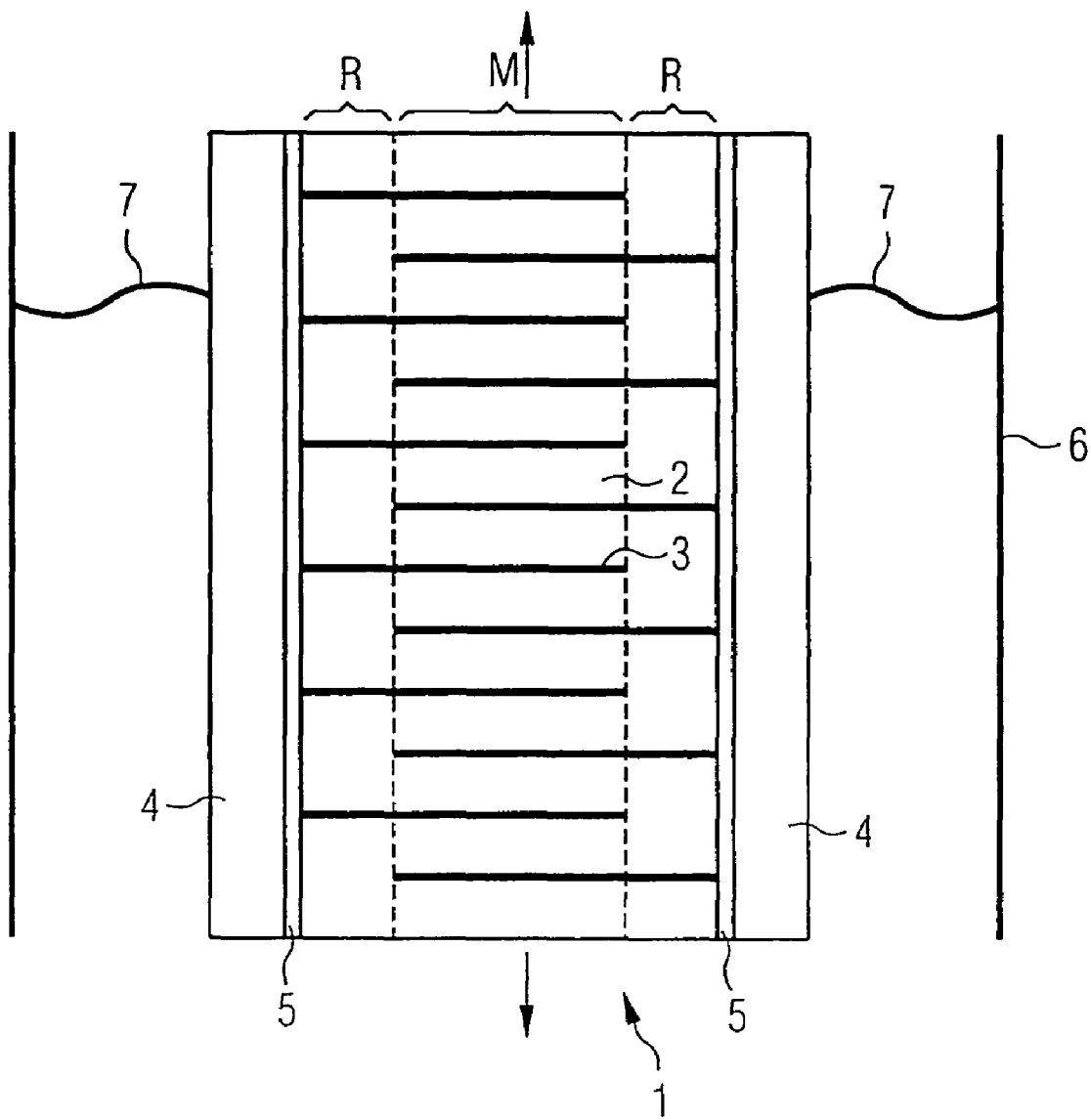

PIEZO-ACTUATOR

CROSS-REFERENCE TO RELATED APPLICATIONS

This application claims priority to PCT Application No. PCT/DE01/04180, filed On Nov. 7, 2001, and to German Patent Application No. 100 55 241.2, filed on Nov. 8, 2000.

TECHNICAL FIELD

This patent application describes a piezoactuator having a stack of piezoelectric layers and electrode layers.

BACKGROUND

Piezoactuators include electrode layers that engage each other like combs. The electrode layers in each comb are electrically connected via contact layers that are arranged at the edge of the stack, and are produced from a silver firing paste. In a center region of the stack, where the electrode layers that belong to different combs overlap, the actuator expands when an electrical voltage is applied. No such expansion takes place in the edge regions of the stack. This results in tensile stresses in the inactive edge regions of the stack.

The tensile stress resistance of ceramic, which is used as a piezoelectric material, is low. Cracks that occur at a border between the center region and the edge region can spread on a surface of the ceramic, thereby endangering the operability of the component. This is because electrode layers in the actuator must be electrically connected to one another, i.e., in contact, to supply voltage at side surfaces of the actuator. An interruption in this electrical connection between electrode layers endangers the voltage supply to the electrode layers. This is because currents can cause resistive heating at a damaged contact location, which leads to thermal destruction of an existing residual conductive connection.

To prevent formation of cracks in the edge region of the actuator, a piezoactuator can be moderately pressure-stressed. Such moderate stress can be provided by clamping the stack into a tube string. The tube spring presses the base surface and the cover surface, respectively, of the actuator against one another at a uni-axial pressure of approximately 850 N.

Moreover, to prevent a failure of electrode layers during interruption of the contact layers arranged at the edge of the stack, numerous individual wires are soldered onto the actuator at regular intervals.

Clamping the actuator into a tube spring and applying of a large number of solder sites onto the contacting layer are complicated processes and are costly.

SUMMARY

Described herein is a piezoactuator that has a stack of piezoelectric layers that lie on top of one another. Electrode layers are arranged between these piezoelectric layers. A stabilization element is attached at a side surface of the stack, which fixes in place the height of the stack at the side surfaces in such a way that the height does not change when an operating voltage is applied to the electrode layers.

The piezoactuator has the advantage that the tensile forces that occur at the side surfaces of the stack when the actuator is in operation can be absorbed by a stabilization element. This eliminates the need for a complicated design, such as the above-described tube spring design.

Furthermore, the stabilization element is attached at the side surfaces of the stack, i.e., at the critical point where tearing of the piezoelectric layers can cause the greatest damage. The stabilization element also provides for a compact structure.

Stabilization of the actuator can be improved by arranging stabilization elements, e.g., on two sides surfaces of the stack.

In an embodiment of the piezoactuator, the stabilization element is a piece of sheet metal that extends over the entire height of the stack. The design of the stabilization element as a piece of sheet metal allows a simple a material-saving way of making the element stable. Also, the stabilization element can be adapted it to various actuator designs. It can be adapted, for example, by the material selected for the sheet metal or by the thickness of the sheet metal used. The mechanical stability of the stabilization element can thus be optimally designed with a minimum use of material. It is advantageous to use sheet metal made of a specific metal, such as copper sheets or even aluminum sheets.

It is advantageous if the stabilization element is attached over the entire surface of a side surface of the stack. Because tensile forces that occur are disturbed over the entire side surface of the stack at the same time, maximum stability is achieved with a minimal attachment force. At the same time, attachment of stabilization element can occur via, e.g., soldering, gluing, or even welding.

An advantageous configuration is a piezoactuator having an electrical contact layer on each of two opposite side surfaces of the stack, for contacting the electrode layers, and having a stabilization element that is attached over the entire surface of each contact layer. The piezoactuator has the advantage that the electrical contact layers can be effectively protected against cracks resulting from tensile stress on the piezoelectric layers via the stabilization elements. In this way, reliability of the electrical contacts of the electrode layers is improved.

Furthermore, it is also advantageous to use the stabilization elements themselves to provide contact between the electrode layers, since the stabilization elements and their attachment to the contact layers are electrically conductive, and since the stabilization elements contact external electrical connectors.

The stabilization elements demonstrate sufficient mechanical strength and are therefore not destroyed by the mechanical tensile stresses, in contrast to contact layers that only serve as electrical contacts. The stabilization elements also allow the application of a reliable contact, for example soldering on a flexible braid, whereby the solder location can be structured in such a solid form that it is not easily damaged even if external vibrations occur.

Furthermore, a piece of sheet metal provided with perforations can be used as the stabilization element. Sheet metal with perforations offers the advantage of a reduced use of material, i.e., it has a lower weight than a solid piece of sheet metal. Because of the perforations in the sheet, sheet metal with perforations can also be attached by soldering more easily than can a solid piece of sheet metal.

DESCRIPTION OF THE DRAWING

The FIGURE shows a cross-sectional schematic of an exemplary piezoactuator.

DETAILED DESCRIPTION

The FIGURE shows a piezoactuator having a stack 1 of piezoelectric layers 2 that lie on top of one another. Piezoelectric layers 2 comprise a piezoceramic containing 67% by weight Pb3O4, approximately 1% by weight Nd$_2$O$_3$, 21% by weight ZrO$_2$ and approximately 11% by weight TiO$_2$. However, the piezoactuator is not restricted to this type of piezoceramic, but rather can be implemented with any piezoelectric layers 2 that demonstrate suitable piezoelectric properties.

Stack 1 has electrode layers 3 that engage one another like combs, causing the piezoelectric effects of many piezoelectric layers 2 to add up. Electrode layers 3 contain a mixture of silver and palladium in a weight ratio between 90/10 and 70/30. Stack 1 is produced by sintering together electrode layers 3 and piezoelectric layers 2, which is why all metals or metal alloys that are stable at sintering temperatures are suitable for use as electrode layers 3. Electrode layers 3 made of copper are a particularly good option. Electrode layers 3 that comprise a comb, in each instance, are connected with one another in an electrically conductive manner via a contact layer 5 that is affixed on the outside of the stack 1. Contact layer 5 can be produced from a silver firing paste, for example.

Stack 1 has the shape of a block with a base of 7×7mm. Stack 1 has a height of 60mm. When a suitable electric voltage is applied between contact layers 5, stack 1 expands in the direction indicated with the two arrows in a center region M, where electrode layers 3 overlap. In an edge region R, where electrode layers 3 do not overlap, stack 1 expands less. Tensile stresses occur in a critical transition zone between center region M and edge region R. These tensile stresses on piezoelectric layer 2 can have an effect all the way to the edge of stack 1. To prevent tearing of piezoelectric layers 2 at the edge of stack 1, a stabilization element 4 is affixed there, in each instance.

An aluminum sheet with a thickness of 2mm, for example, can be used as stabilization element 4. Stabilization element 4 extends over the entire height of the stack 1. Stabilization element 4, together with an appropriate form of fastening such as soldering, fixes the height of stack 1 in such a way that the heights does not change even when the piezoactuator is in operation. This prevents the occurrence of cracks in the edge region R of piezoelectric layers 2.

Furthermore, the stabilization element 4 can be a metallically conductive sheet metal, and thus can also be used to provide electrical contact for electrode layers 3. This is done, for example, by electrically connecting stabilization element 4 with a fixed external connector 6 via a braid 7 made of copper wire.

The claims not limited to the exemplary embodiment shown.

The invention claimed is:

1. An actuator comprising:
   a stack of piezoelectric layers;
   electrode layers among the piezoelectric layers; and
   a stabilization element attached to a side surface of the stack, the stabilization element fixing a longitudinal height of part of the stack so that the longitudinal height of the part of the stack does not change when an operating voltage is applied to at least two neighboring electrode layers, wherein the stabilization element comprises sheet metal.

2. The actuator according to claim 1, wherein the sheet metal extends over the longitudinal height of the stack.

3. The actuator according to claim 2, wherein the sheet metal is attached to the stack over substantially an entire surface of sheet metal.

4. The actuator according to claim 3, wherein the sheet metal is attached to the stack via at least one of soldering, gluing and welding.

5. The actuator according to claim 1, further comprising:
   an electrical contact layer that contacts at least some of the electrode layers, the electrical contact layer being arranged on a side surface of the stack;
   wherein the stabilization element is attached to the electrical contact layer.

6. The actuator according to claim 5, wherein the stabilization element comprises electrical contacts that connect to the electrical contact layer, the electrical contacts being electrically conductive, and wherein the stabilization element includes an external electrical connector.

7. The actuator according to claim 1, wherein the sheet metal has perforations.

8. The actuator according to claim 1, wherein the stabilization element comprises two elements attached on opposite side surfaces of the stack.

9. The actuator of claim 1, wherein the actuator comprises a piezoactuator.

10. An actuator comprising:
    piezoelectric layers;
    electrode layers among the piezoelectric layers; and
    a stabilizing element disposed adjacent at least some of the piezoelectric layers and at least some of the electrode layers, the stabilizing element maintaining a height, in a longitudinal direction, of part of the actuator in a presence of applied voltage, wherein the stabilizing element comprises sheet metal.

11. The actuator of claim 10, wherein the height of the actuator is defined, in part, by the piezoelectric layers and the electrode layers.

12. The actuator of claim 10, wherein the piezoelectric layers and the electrode layers define a stack, the stabilizing element being disposed adjacent to a side of the stack.

13. The actuator of claim 12, further comprising:
    a contact layer disposed between the stabilizing element and the stack.

14. The actuator of claim 12, wherein the stabilizing element comprises plural metal sheets located on sides of the stack.

15. The actuator of claim 10, wherein the actuator comprises a piezoactuator.

16. The actuator of claim 1, wherein the height comprises a height of the side surface of the stack; and
    wherein a center of the stack is expandable when the height of the surface of the stack is fixed.

17. The actuator of claim 1, further comprising:
    a second stabilization element attached to a second side surface of the stack, the second stabilization element fixing a height of the stack so that the height does not change when an operating voltage is applied to at least one of the electrode layers.

18. The actuator of claim 10, wherein the height comprises a height of a side surface of a stack defined by the electrode layers and the piezoelectric layers; and
    wherein a center of the stack is expandable when the height of the side surface of the stack is fixed.

19. The actuator of claim 1, wherein the stabilization element is attached to the stack over substantially an entire surface of the stabilization element.

* * * * *